United States Patent [19]

Aoyama

[11] Patent Number: 4,578,778
[45] Date of Patent: Mar. 25, 1986

[54] SEMICONDUCTOR MEMORY WITH LOAD CONTROLLING FEEDBACK MEANS TO REDUCE POWER CONSUMPTION

[75] Inventor: Keizo Aoyama, Yamato, Japan

[73] Assignee: Fujitsu Limited, Kawasaki, Japan

[21] Appl. No.: 413,752

[22] Filed: Sep. 1, 1982

[30] Foreign Application Priority Data

Sep. 1, 1981 [JP] Japan ................. 56-136066
Sep. 1, 1981 [JP] Japan ................. 56-136067
Sep. 1, 1981 [JP] Japan ................. 56-136068

[51] Int. Cl.$^4$ .................. G11C 7/00; G11C 11/40
[52] U.S. Cl. .................... 365/190; 365/154; 365/227
[58] Field of Search .......... 365/154, 156, 190, 227, 365/189

[56] References Cited

U.S. PATENT DOCUMENTS 3,983,543  9/1976  Cordaro ................. 365/156
4,195,356  3/1980  O'Connell et al. ........ 365/189
4,236,229  11/1980 Caudel .................. 365/154

FOREIGN PATENT DOCUMENTS 0113222  4/1979  Japan .

OTHER PUBLICATIONS

Anderson et al., "Memory Cell Sensing Scheme", IBM Technical Disclosure Bulletin, vol. 17, No. 6, Nov. 1974.
Konishi et al., "A 64Kb CMOS RAM", Digest of Technical Papers-IEEE International Solid State Circuits Conference, Feb. 12, 1982, pp. 258-259.
Eardley, "Static Cell Array Circuit to Enable Write by Turning Off the Cell Load Devices", IBM Tech. Disclosure Bull., vol. 24, No. 6, Nov. '81, pp. 3044-3047.

Primary Examiner—Stuart N. Hecker
Assistant Examiner—Glenn A. Gossage
Attorney, Agent, or Firm—Staas & Halsey

[57] ABSTRACT

A semiconductor memory circuit including a pair of feedback means. The feedback means are connected between pairs of conventional bit lines and control gates of conventional load transistors. The feedback means control the on or off state of these load transistors in accordance with the logic states of the pair of bit lines.

16 Claims, 11 Drawing Figures

SEMICONDUCTOR MEMORY WITH LOAD CONTROLLING FEEDBACK MEANS TO REDUCE POWER CONSUMPTION

BACKGROUND OF THE INVENTION

1. Field of the Invention

The present invention relates to a semiconductor memory circuit, more particularly to a semiconductor static memory circuit.

2. Description of the Prior Art

Generally, a semiconductor memory circuit of the static type comprises, as basic constituent elements, a plurality of pairs of bit lines (BL, $\overline{BL}$) extending in Y direction, a plurality of memory cells located inside each pair of bit lines and connected thereto, a pair of load transistors inserted in each pair of bit lines, word lines extending in the X direction for selecting one of the memory cells to be accessed, and so on. The above-mentioned conventional semiconductor memory circuit, however, suffers from two shortcomings, i.e., an unnecessarily large power consumption and a long access time.

The unnecessarily large power consumption is due to the fact that there is always a continuous current flowing in one of the bit lines via the corresponding load transistor.

The long access time is due to the fact that in transferring data from an accessed memory cell to the corresponding bit line, the memory cell must absorb the continuous current via its transistors and transfer the stored data to the corresponding bit line. This naturally slows down the reading speed for the data. Related to this is the mutual conductance $g_m$, mainly the $g_m$ of the load transistor. Access time can be improved by increasing the $g_m$. However, the larger the $g_m$, the larger the size of the transistor itself. The desire for high integration density has therefore led, in most cases, to the $g_m$ being designed smaller and smaller, at the expense of the access time.

SUMMARY OF THE INVENTION

It is an object of the present invention to provide a semiconductor memory circuit which can eliminate the above-mentioned shortcomings.

The above object is attained by a feedback means for controlling at least one of the load transistors in accordance with the logic state of at least one of the corresponding bit lines. The semiconductor memory circuit of the present invention includes a pair of feedback means connected between a pair of bit lines and control gates of load transistors. The feedback means control the on or off state of the load transistors in accordance with the logic states of the pair of bit lines.

BRIEF DESCRIPTION OF THE DRAWINGS

The present invention will be more apparent from the ensuing description with reference to the accompanying drawings, wherein:

FIG. 5(a)-5(e) depict waveforms of signals used for explaining a fourth embodiment of the present invention;

FIG. 11(a)-11(f) depict waveforms of signals used for explaining the sixth embodiment of FIG. 10.

DESCRIPTION OF THE PREFERRED EMBODIMENTS

Figure 1:
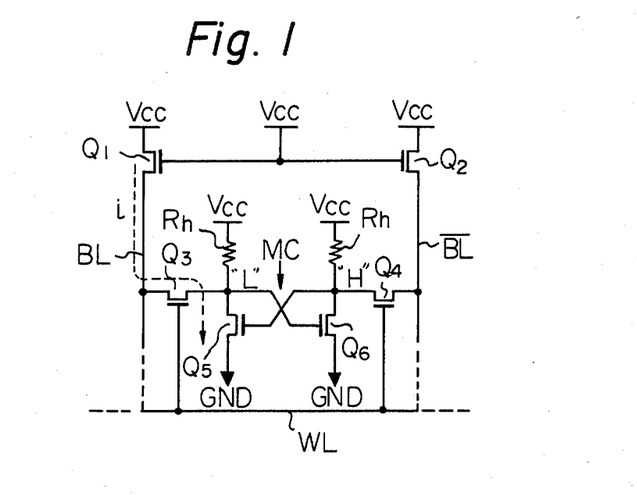
FIG. 1 is a circuit diagram of a conventional static type semiconductor memory circuit.

FIG. 1 is a circuit diagram of a conventional static type semiconductor memory circuit. It should be understood that FIG. 1 shows only a part of the circuit diagram. Many identical memory cells, many identical pairs of bit lines, and many identical word lines actually exist. Also, FIG. 1 does not illustrate the write buffer for writing data and the sense amplifier for reading data, which actually exist and are connected to each pair of bit lines.

In any case, in FIG. 1, the reference symbols BL and $\overline{BL}$ represent a pair of bit lines. A memory cell MC cooperates with the bit lines BL and $\overline{BL}$. A pair of load transistors $Q_1$ and $Q_2$ are inserted in the pair of bit lines BL and $\overline{BL}$. The memory cell MC also cooperates with a word line WL. Thus, when desired, the memory cell MC can be accessed by means of the bit lines and the word line.

Suppose now that a logic "L" is stored in the memory cell MC at its BL side (therefore, an opposite logic "H" is stored at its $\overline{BL}$ side) and that the memory cell MC is accessed by the word line WL. Since the logics "L" and "H" are therefore stored as shown in FIG. 1, the transistor $Q_5$ of the memory cell MC is on and the transistor $Q_6$ is off. Since the word line WL is also accessed, both the transistor $Q_3$ and the transistor $Q_4$ are also on.

Since both the transistors $Q_3$ and $Q_5$ are on, a current i flows from a power source $V_{CC}$ to ground GND via the load transistor $Q_1$, as shown by the broken arrow. This current i corresponds to the previously mentioned continuous current and continues flowing as long as the memory cell MC is being accessed. This means unnecessary power consumption, i.e., the aforementioned first shortcoming.

On the other hand, in effecting read access in the memory cell MC, the memory cell MC must simultaneously absorb the continous current i via the transistors $Q_3$ and $Q_5$ and transfer the stored data to the bit line BL. Accordingly, the memory cell MC must effect the read operation against both the capacitive load of the bit line BL and the load of the continuous current i. This hinders the shortening of the across time, the aforementioned second shortcoming.

To eliminate the above-mentioned shortcomings, according to the present invention, a pair of feedback means is introduced into the memory circuit. The feedback means are connected between the pair of bit lines and control gates of the pair of load transistors $Q_1$ and $Q_2$. The feedback means control the on or off state of the load transistors in accordance with the logic states of the pair of bit lines BL and $\overline{BL}$. The effect of this is to make the mutual conductance $g_m$ of the load transistors $Q_1$ and $Q_2$ suitably variable. This improves both the power consumption and the access time. To be more specific, the $g_m$ is made large to improve the access time and is made small, after the continuous current i starts flowing, to improve the power consumption.

The present invention is explained in more detail below with reference to preferred embodiments.

According to a first embodiment of the present invention, the pair of feedback means is comprised of a pair of level converters. Each level converter converts the voltage of the corresponding bit line and applies the converted voltage to the control gate of the load transistor connected to the bit line.

Figure 2:
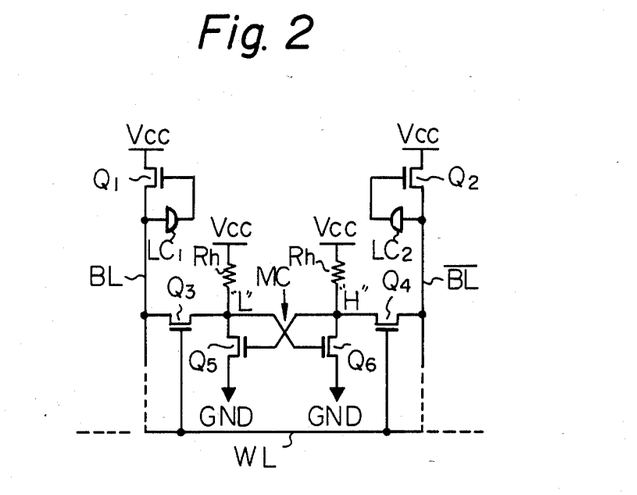
FIG. 2 is a circuit diagram of a semiconductor memory circuit according to a first embodiment of the present invention.

FIG. 2 is a circuit diagram of a semiconductor memory circuit according to the first embodiment of the present invention. In FIG. 2, reference symbols the same as those in FIG. 1 represent the same members. The reference symbols $LC_1$ and $LC_2$ represent the pair of level converters newly employed according to the present invention.

The level converters $LC_1$ and $LC_2$ can each be fabricated by two inverters connected in cascade. As widely known, an inverter is comprised of two field effect transistors (FET) connected in series. The inverter used here as the level converter can be made of a complementary metal oxide semiconductor (CMOS) type FET circuit or an enhancement and depletion type FET circuit. Use of a CMOS type FET circuit as the level converter is advantageous in view of the power consumption, because the CMOS type FET circuit doesn't dissipate the continuous current. Use of an enhancement and depletion type FET circuit is advantageous in view of the power consumption, because the gate capacitance of each load transistor is extremely small compared with the capacitance along the bit line, whereby no problem is raised regarding the power consumption.

The level converters $LC_1$ and $LC_2$ receive logic signals appearing on the bit lines BL and $\overline{BL}$, respectively, and convert the level thereof. The converted logic signals are applied to the control gates of the load transistors $Q_1$ and $Q_2$. In FIG. 2, the control gates are gates of field effect transistors (FET).

Referring back to the explanation in reference to FIG. 1, the logic "L" is stored on the transistor $Q_5$ side, a logic "H" is stored on the transistor $Q_6$ side, and the memory cell MC is accessed by the word line WL. Under such conditions, the current i (see FIG. 1) will start flowing. Now, before the current actually starts flowing, the logic level on the bit line BL is not sufficiently reduced to the "L" level, but is rather maintained near the "H" level. The level converter $LC_1$ (FIG. 1) converts the "H" level and applies a sufficiently high "H" level to the gate of the transistor $Q_1$. Thus, the load transistor $Q_1$ is maintained at a full on state. This state is equivalent to a large $g_m$.

In this on state, when the memory cell MC is accessed, the current i (see FIG. 1) can rapidly rise to the saturation level. This current i is then absorbed, via the transistors $Q_3$ and $Q_5$ and by ground GND, whereby the logic level of the bit line BL rapidly falls to the "L" level. The level converter $LC_1$ (FIG. 1) then converts this "L" level and applies a sufficiently low "L" level to the gate of the transistor $Q_1$. This rapidly turns off the load transistor $Q_1$ and maintains it in the off state. This state is equivalent to a small $g_m$.

The change from a large manual conductance $g_m$ to a small $g_m$ is completed quickly due to the positive feedback function of the feedback means.

It is very advantageous for the memory circuit of FIG. 2 that, as mentioned above, the load transistor $Q_1$ is quickly turned off soon after the memory cell MC is accessed. This is because, since the current i is quickly reduced soon after the memory cell MC is accessed, the only load seen from the memory cell MC is the capacitance of the bit line BL. The absorption of the current i no longer comprises a load as seen therefrom during the read operation of the memory cell MC. This enables shortening of the access time, thus eliminating the aforesaid second shortcoming. At the same time, the quick reduction of the current i and its maintenance at zero amplitude improves the power consumption, eliminating the aforesaid first shortcoming.

According to a second embodiment of the present invention, the pair of feedback means also comprises a pair of level converters. Here, however, each level converter inverts the voltage of the corresponding bit line and applies the inverted voltage to the control gate of the load transistors connected to the other bit lines.

Figure 3:
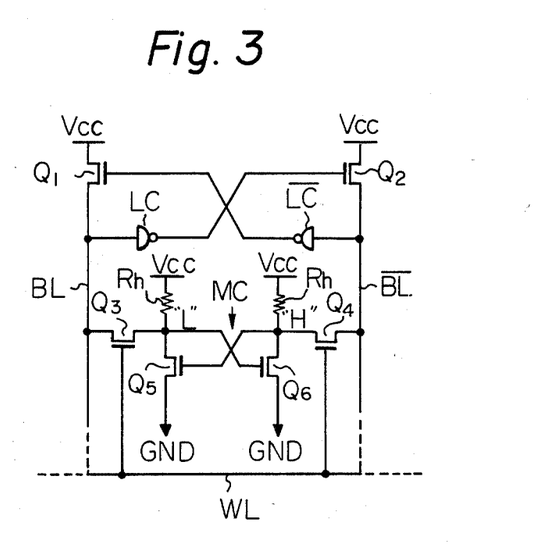
FIG. 3 is a circuit diagram of a semiconductor memory circuit according to a second embodiment of the present invention.

FIG. 3 is a circuit diagram of a semiconductor memory circuit according to the second embodiment of the present invention. In FIG. 3, reference symbols the same as those in FIG. 1 represent the same members. The reference symbols LC and $\overline{LC}$ represent the pair of level converters newly employed according to the present invention. The level converters LC and $\overline{LC}$ can each be fabricated, as a most simple example, by a well known inverter.

The difference between the level converters LC and $\overline{LC}$ and the level converters $LC_1$ and $LC_2$ of the first embodiment is that with the level converters LC and $\overline{LC}$, the logic signal for changing the mutual conductance $g_m$ is obtained from the other side (mutual-feedback type), while with the level converters $LC_1$ and $LC_2$, it is obtained from the same side (self-feedback type). This is made possible by the fact that the logic of the bit line pair BL and $\overline{BL}$ are always complementary to each other. Accordingly, each of the level converters LC and $\overline{LC}$ of FIG. 3 should have a function for inverting the logic level, i.e., "H"→"L" or "L"→"H". The operation of the circuit shown in FIG. 3 and the advantages produced therefrom are almost identical to those of the circuit shown in FIG. 2.

In the first and second embodiments, the feedback means are comprised of circuit elements such as inverters. A feedback means with the same function can also be realized merely with wiring if the conductivity types of the transistors are suitably selected. According to a third embodiment of the present invention, therefore, each transistor comprising the memory cell is made of either a p-channel or n-channel transistor. Each corresponding load transistor is made of the opposite conductivity type channel transistor. The pair of feedback means is comprised of two wirings. One is connected between a first bit line of the pair of bit lines and the control gate of the load transistor connected to the second bit line of the pair of bit lines. The other wiring is connected between the second bit line and the control gate of the load transistor connected to the first bit line.

Figure 4:
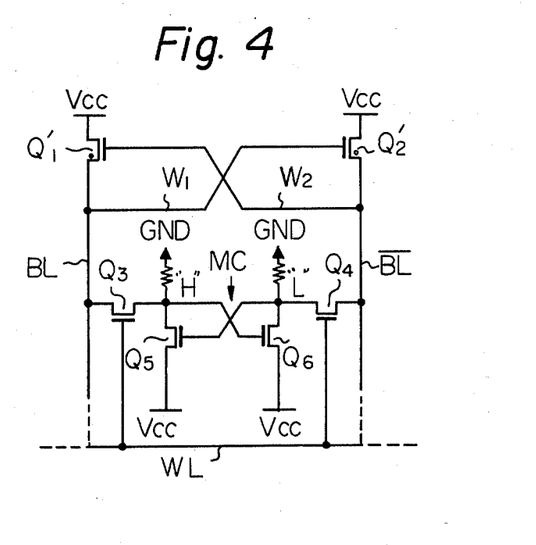
FIG. 4 is a circuit diagram of a semiconductor memory circuit according to a third embodiment of the present invention.

FIG. 4 is a circuit diagram of a semiconductor memory circuit according to the third embodiment of the present invention. In FIG. 4, reference symbols the same as in previous figures represent the same members. Each of the transistors $Q_3$, $Q_4$, $Q_5$ and $Q_6$ comprising the memory cell MC are n-channel transistors and each of the load transistors $Q_1'$ and $Q_2'$ are p-channel transistors. The pair of feedback means comprises two wirings $W_1$ and $W_2$. The wiring $W_1$ is connected between the bit lines BL and the control gate of the load transistor $Q_2$ connected to the bit line $\overline{BL}$. The wiring $W_2$ is connected between the bit line $\overline{BL}$ and the control gate of the load transistor $Q_1$ connected to the bit line BL.

Figure 5:
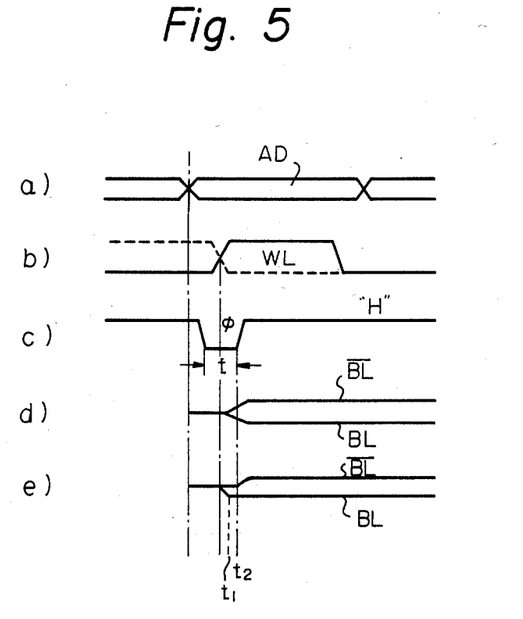

Now, in relation to the first through third embodiments, there is still a slight possibility of further improving the characteristics of the access time. This will be apparent from FIG. 5. Row (d) of FIG. 5 depicts a waveform of signals appearing in the memory circuit of the first to third embodiment shown in FIGS. 2, 3, and 4. Access time is defined as the time from when the memory cell MC is accessed to when the difference level between the bit lines BL and $\overline{BL}$ exceeds a predetermined value. The access time may further be shortened if the waveform of at least one of the signals in row (d) of FIG. 5 sharply rises or falls.

Row (a) of FIG. 5 depicts a row address input, that is, an address signal AD to be applied from outside the memory circuit to a word decoder. Row (b) depicts the change in the level of the word line WL. When the memory cell MC is accessed, the corresponding word line WL changes from the "L" to "H" level.

According to a fourth embodiment of the present invention, a pair of gate means is further introduced in the semiconductor memory circuit. The features of the fourth embodiment are well depicted by the waveforms in rows (c) and (e) of FIG. 5. With reference to row (e), the difference level between the bit lines BL and $\overline{BL}$, varies more sharply than that shown in row (d). This means that the access time is shortened more than that shown in row (d). The shortened access time is created by a gate pulse $\phi$ (see row (c)). The gate pulse $\phi$ is generated immediately after the accessing operation for the memory cell MC commences, which corresponds to when the row address input changes. The gate pulse $\phi$ operates to turn off the pair of gate means during a predetermined interval t.

Figure 6:
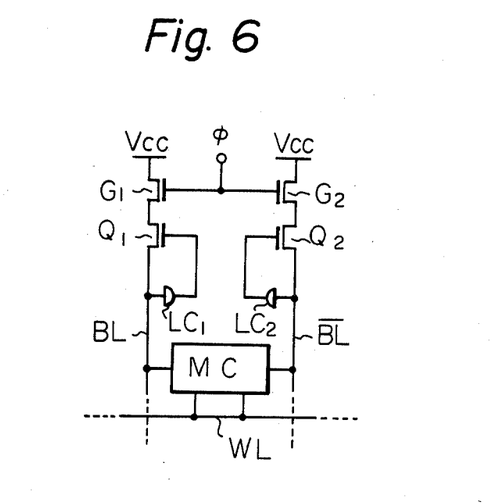
FIG. 6 is a circuit diagram of a semiconductor memory circuit according to the fourth embodiment of the present invention, based on the circuit of FIG. 2.

FIG. 6 is a circuit diagram of a semiconductor memory circuit according to the fourth embodiment of the present invention based on the circuit of FIG. 2. In FIG. 6, the reference symbols the same as in previous figures represent the same members. Reference symbols $G_1$ and $G_2$ represent the pair of gate means, shown as transistors in this figure. Referring again to the explanation in reference to FIG. 1, in accessing a memory cell MC, data "L" is read via the bit line BL, the level of the bit line BL changes toward the "L" level, and, after a while, the load transistor $Q_1$ is turned off and maintained in the off state by means of the level converter $LC_1$. Usually, it takes too long to turn off the transistor $Q_1$. The memory cell MC unnecessarily absorbs the aforesaid continuous current i until the transistor $Q_1$ is completely turned off. In the fourth embodiment, the gate means $G_1$ and $G_2$ operate to stop the supply power from the power source $V_{CC}$ to the bit lines BL and $\overline{BL}$, during the predetermined short interval t, regardless of the on or off state of the load transistors $Q_1$ and $Q_2$.

Thus, the memory cell MC can rapidly transfer the data "L" to the bit line BL because the memory cell MC does not unnecessarily absorb the aforesaid continuous current. In this case, since the gate means $G_2$ is also off, the bit line $\overline{BL}$ is charged from the memory cell MC side. However, after the bit line BL is fully changed to the "L" level, that is, after the time $t_1$ in row (e) of FIG. 5, the gate means $G_1$ and $G_2$ are turned on at the time $t_2$ in row (e) of FIG. 5. Accordingly, the bit line $\overline{BL}$ is rapidly charged from the $V_{CC}$ side (at this time, the load transistor $Q_2$ is also turned on). It should be noted that, although the gate means $G_1$ is turned on after the time $t_2$, since the load transistor $Q_1$ has been turned off before the time $t_2$, the "L" level of the bit line BL is not changed by the gate means $G_1$.

According to a fifth embodiment of the present invention, a pair of gate means is introduced in the semiconductor memory circuit as in the fourth embodiment. Here, however, each of the pair of gate means is combined with the corresponding pair of feedback means so as to create a logic state having an output to be connected to the control gate of the corresponding load transistor. Thus, the pair of feedback means are made active by the gate pulse.

Figure 7:
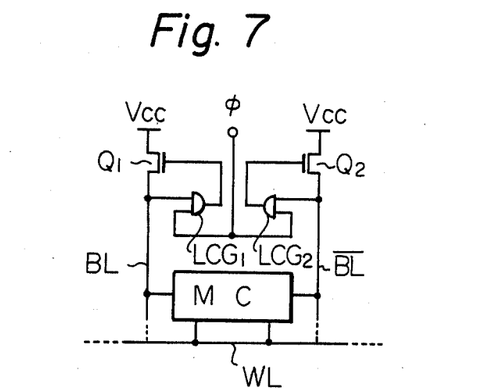
FIG. 7 is a circuit diagram of a semiconductor memory circuit according to a fifth embodiment of the present invention, based on the circuit of FIG. 2.

FIG. 7 is a circuit diagram of a semiconductor memory circuit according to a fifth embodiment of the present invention based on the circuit of FIG. 2. In FIG. 7, reference symbols the same as in the previous figures represent the same members. Reference symbols $LCG_1$ and $LCG_2$ represent 2-input AND gates equivalent to combinations of the gate means $G_1$ and $G_2$ of FIG. 6 and the level converters $LC_1$ and $LC_2$ of FIG. 2. The outputs of the AND gates $LCG_1$ and $LCG_2$ are connected to the control gates of the load transistors $Q_1$ and $Q_2$, respectively.

The operation of the circuit shown in FIG. 7 is substantially the same as that of the circuit shown in FIG. 6. When the gate pulse $\phi$ is the "L" level, both load transistors $Q_1$ and $Q_2$ are off, therefore the level of the bit line BL is soon changed to "L" at the time $t_1$, as shown in the row (e) of FIG. 5. Thereafter, even though the gate pulse $\phi$ returns to the "H" level, the 2-input AND gate $LCG_1$ continues supplying the "L" level of the bit line BL to the control gate of the load transistor $Q_1$ to maintain it in the off state. On the other hand, regarding the 2-input AND gate $LCG_2$, when the gate pulse $\phi$ is the "H" level, the two inputs thereof both receive the "H" level, thereby maintaining the load transistor $Q_2$ in the on state.

Figure 8:
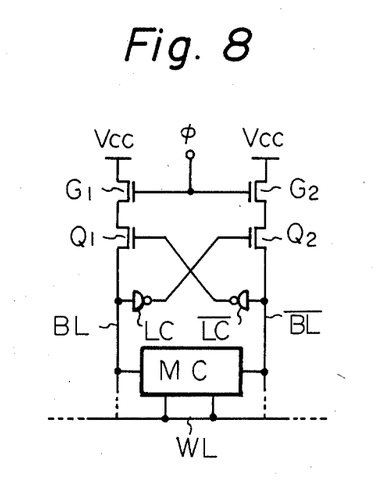
FIG. 8 is a circuit diagram of a semiconductor memory circuit according to the fifth embodiment of the present invention, based on the circuit of FIG. 3.

The above-mentioned operation was explained with reference to the circuit based on the circuit shown in FIG. 2. The same operation can also be affected, however, by circuits based on the circuit shown in FIG. 3, for example, the circuits shown in FIGS. 8 and 9. These two modifications of the fifth embodiment correspond to the previously-mentioned mutual-feedback type circuit, while the fourth embodiment and above-mentioned fifth embodiment (FIGS. 6 and 7) correspond to the previously-mentioned self-feedback type circuit. However, the principle of operation is the same embodiment, i.e., the load transistor $Q_1$ and $Q_2$ are off during the predetermined short interval immediately after the operation for accessing the memory cell commences, only the gate pulse for controlling the NOR gate is the "H" level and is represented by $\phi'$ in FIG. 9.

Figure 9:
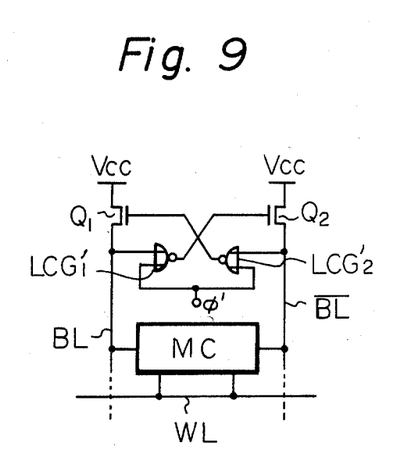
FIG. 9 is a circuit diagram of another semiconductor memory circuit according to the fifth embodiment of the present invention, based on the circuit of FIG. 3.

The aforesaid logic gates are formed, in FIG. 9, as NOR gates $LCG_1'$ and $LCG_2'$.

The first to fifth embodiments mainly take into consideration the suppresion of the continuous current i during the time the bit line BL is the "L" level. However, it is also possible to increase the charging speed of the bit line $\overline{BL}$ on the "H" level side. This is due to the following fact. With reference to FIG. 6 and the bit line $\overline{BL}$ to be charged to the "H" level, when the gate transistor $G_2$ is off during the generation of the gate pulse $\phi$, the route for charging the bit line $\overline{BL}$ to the power source ($V_{CC}$) level, that is the "H" level, is cut by the transistor $G_2$, now nonconductive. Consequently, the bit line $\overline{BL}$ has to be charged to the "H" level from the memory cell MC side. However, in the memory cell MC, resistors $R_h$ having high resistance values are used, as shown in FIG. 1, 2, and 3. Accordingly, the bit line $\overline{BL}$ must be charged through the high resistance resistors $R_h$ by the power source $V_{CC}$. Therefore, it is difficult to charge the bit line BL very quickly. This results in increased access time.

Further, the presence of the high resistance resistor $R_h$ leads to the possibility of creating a so-called write error. That is, if the logic of data stored in a first memory cell accessed by the corresponding word line and the logic of data stored in a second memory cell to be accessed and belonging to the same bit line pair as that of the first memory cell, are opposite from each other, there is a possibility that the "H" level data of the second memory cell to be accessed will be erased and, in addition, rewritten by the "L" level data of the previously accessed first memory cell. This will be apparent from the fact that, referring to, for example, FIG. 2, although the "H" level to be created by the transistor $Q_6$ is produced gradually through the high resistance resistor $R_h$, the "L" level created by the transistor $Q_5$ is produced quickly by direct connection to ground GND.

A sixth embodiment, explained next, is useful for improving the access time and also eliminating the write error. According to the sixth embodiment of the present invention, a second pair of gate means is further introduced in the semiconductor memory circuit. The second pair of the gate means is commonly controlled by a second gate pulse in addition to the fifth embodiment's pair of gate means commonly controlled by the first gate pulse. The second gate means are connected between the power source and corresponding bit line and are turned on by the second gate pulse. The second gate pulse is generated at almost the same time as the first gate pulse, but has a pulse width smaller than that of the first gate pulse.

Figure 10:
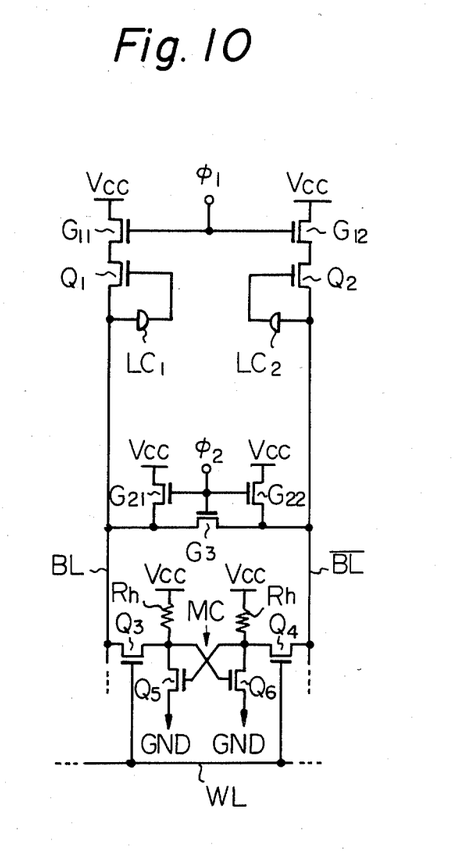
FIG. 10 is a circuit diagram of a semiconductor memory circuit according to a sixth embodiment of the present invention.

FIG. 10 is a circuit diagram of a semiconductor memory circuit according to the sixth embodiment of the present invention. The circuit of this figure is based on the circuit of FIG. 6. In FIG. 10, reference symbols the same as in previous figures represent the same members. Reference symbols $G_{11}$, $G_{12}$, and $\phi_1$ represent the two first gate means and gate pulse and are the same as the gate means $G_1$ and $G_2$ and the gate pulse $\phi$ shown in FIG. 6. Reference symbols $G_{21}$, $G_{22}$, $G_3$, and $\phi_2$ represent the respective two second gate means, the third gate means, and the second gate pulse characterizing the sixth embodiment.

Figure 11:
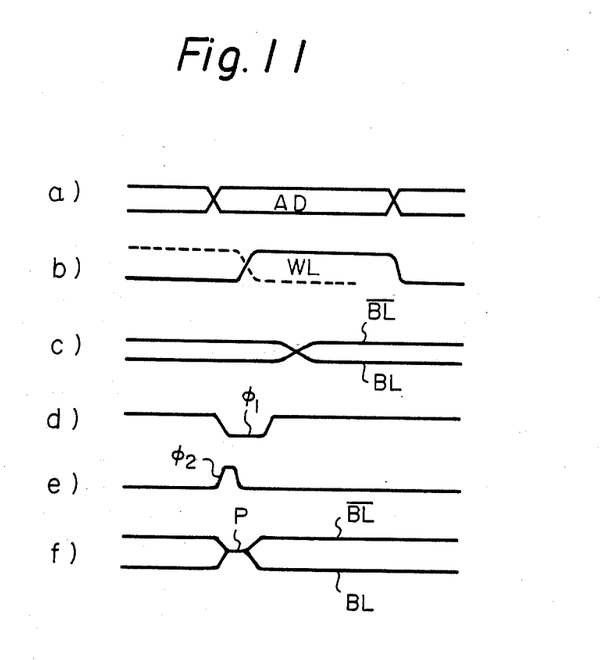

The operations are as follows. FIG. 11 depicts waveforms of signals used for explaining the sixth embodiment of FIG. 10. The waveforms shown in rows (a), (b), and (d) of FIG. 11 are the same as those shown in rows (a), (b), and (c) of FIG. 5. In FIG. 11, attention should be paid to the waveform in row (e) showing the second gate pulse $\phi_2$. The second gate pulse $\phi_2$ is generated at almost the same time as the first gate pulse $\phi_1$, but has a pulse width smaller than that of the first gate pulse $\phi_1$. When the gate pulse $\phi_2$ is commonly applied to the pair of second gate means $G_{21}$ and $G_{22}$, these are both turned on, and, thereby, the bit lines BL and $\overline{BL}$ are directly connected to the power source $V_{CC}$. Therefore, although the bit lines are disconnected from the power source (shown at top in FIG. 10) due to the first gate means $G_{11}$ and $G_{12}$, both nonconductive, the bit lines are rapidly charged to the $V_{CC}$ level due to the second gate means $G_{21}$ and $G_{22}$, both conductive. Thus, the bit line $\overline{BL}$, can be rapidly charged to the "H" level (this is also true in the case where the bit line BL is going to be charged to the "H" level). As a result, the access time can be considerably shortened and, further, the aforesaid write error can be eliminated. In this case, it may seemingly be of no use to turn the first gate $G_{21}$ on and charge the level of the bit line BL in addition to the bit line $\overline{BL}$, because the bit line BL is now going to be reduced to the "L" level. That is, it may be reasonable to turn on either one of the second gate means $G_{21}$ or $G_{22}$, the gate means connected to the bit line to be charged to the "H" level. However, since the second gate pulse $\phi_2$ is a pulse generated momentarily and, in addition, is generated immediately after the occurrence of the access to the memory cell, it is troublesome to select either one of the second gate means and then apply the second pulse $\phi_2$ only to the selected second gate means every time the memory cell is accessed. There would be no remarkable merit in doing this. This is because, although the "H" level is supplied momentarily (at the interval of $\phi_2$) to the bit line to be reduced to the "L" level, since the transistor ($Q_5$ or $Q_6$) connected to this bit line is directly connected to ground GND, the level change from "H" to "L" can be achieved very quickly. Anyway, it is beneficial that the bit line to be charged to the "H" level, the charging of which would ordinarily be achieved slowly due to the presence of the high resistance resistor $R_h$, is now charged externally to the "H" level according to the sixth embodiment.

It is preferable to add a third gate means $G_3$, as shown in FIG. 10. The third gate means $G_3$ is also turned on by the gate pulse $\phi_2$, as are the second gate means $G_{21}$ and $G_{22}$. However, the third gate means $G_3$ operates to create a short between the pair of bit lines BL and $\overline{BL}$. As previously mentioned, it is the subject matter of the sixth embodiment to attain a quick change to the "H" level and, in addition, it takes a considerably long time for the change, especially from the "L" level to "H" level. From this point of view and by taking into consideration the fact that the levels of the pair of bit lines are complementary, a voltage potential of the "L" level side can be charged relatively quickly with the aid of a voltage potential created by the "H" level of the other side if the bit lines BL and $\overline{BL}$ are shorted immediately after the memory cell is accessed, thereby allowing the change to the "H" level to be completed at a higher speed.

However, shorting the bit lines BL and $\overline{BL}$ is equivalent to reset operations for both the bit lines every time a read access occurs. Therefore, as shown in the row (f) of FIG. 11, the levels of the bit lines change from a constant level P to both the upper level and lower level. Since the level change starts from the constant level P at any time, the levels of the bit lines are always uniformly reset to the level P, regardless of the levels thereof developed immediately before the access for the memory cell commences. This fact is advantageous for shortening the access time. That is, with respect to the same bit line, the time required for changing the level which has been "H" to the level of "L" ("H"→"L") can be shortened to the time required for changing the level which has been P to the level of "L" (P→"L"), because the difference level of |P−L| is smaller than that of |H−L|.

The row (c) of FIG. 11 corresponds to the row (d) of FIG. 5. The row (f) of FIG. 11 corresponds to the row (e) of FIG. 5. The waveforms represented in rows (c) and (f) of FIG. 11 are slightly modified with respect to those represented in rows (d) and (e) of FIG. 5, but these modifications are not important. Further, the waveform of the row (c) in FIG. 11 represents a conventional level change, while, the waveform of row (f) in FIG. 11 represents a level change according to the sixth embodiment incorporating the shortened access time.

As mentioned above in detail, according to the present invention, a semiconductor memory circuit can be realized which is advantageous for low power consumption and also for short access time. In addition, write errors can be eliminated.

I claim:

1. A semiconductor memory circuit comprising:
   first and second bit lines each having a high or low level logic state;
   a memory cell including a flip-flop circuit, said flip-flop circuit having first and second pull down transistors operatively connected to said first and second bit lines, respectively;
   first and second load transistors, operatively connected between a power source and said first and second bit lines, respectively, said first and second load transistors each having a control gate and each having a large $g_m$ state and a small $g_m$ state;
   a word line, operatively connected to said memory cell, for accessing said memory cell; and
   first and second feedback means, operatively connected between said first and second bit lines and said control gates of said first and second load transistors, respectively, for controlling one of said load transistors connected to said bit line having the lower level, to have the small $g_m$ state, and for controlling the other one of said load transistors connected to said bit line having the higher level, to have the large $g_m$ state.

2. A semiconductor memory circuit as set forth in claim 1, wherein said first and second feedback means comprise first and second AND logic gates, respectively, each of said logic gates having a first input operatively connected to a respective bit line, and having a second input operatively connected to receive a gate pulse, each of said logic gates having an output operatively connected to said control gates of said first and second load transistors, respectively, whereby said first and second feedback means are de-activated upon receipt of the gate pulse to immediately cause said first and second load transistors to have small $g_m$ states for a predetermined interval of time after which said first and second feedback means control said first and second load transistors to have a large $g_m$ state and a small $g_m$ state, accordingly.

3. A semiconductor memory circuit as set forth in claim 1, wherein said first and second feedback means comprise first and second level converters, operatively connected to said first and second bit lines, respectively, each of said first and second level converters converting the magnitude of the levels of said first and second bit lines, respectively, and applying the respective converted levels to said control gates of said first and second load transistors, respectively.

4. A semiconductor memory circuit as set forth in claim 3, wherein said first and second level converters each comprise two inverters connected in series.

5. A semiconductor memory circuit as set forth in claim 1, operatively connected to receive a gate pulse and a supply of power, further comprising first and second gate means, respectively, operatively connected to said first and second bit lines and operatively connected to receive the gate pulse, for stopping the supply of power to said first and second bit lines upon receipt of the gate pulse during a predetermined interval.

6. A semiconductor memory circuit as set forth in claim 5, wherein said first and second gate means are operatively connected between the power supply and said first and second load transistors, respectively.

7. A semiconductor memory circuit as set forth in claim 6, operatively connected to receive a second gate pulse having a width smaller than that of the first gate pulse, and further comprising third and fourth gate means, operatively connected between the power supply and said first and second bit lines, turning on upon receipt of the second gate pulse which is generated at approximately the same time as the first gate pulse.

8. A semiconductor memory circuit as set forth in claim 5, operatively connected to receive a second gate pulse having a width smaller than that of the first gate pulse, further comprising third and fourth gate means, operatively connected between the power supply and said first and second bit lines, turning on upon receipt of the second gate pulse which is generated at approximately the same time as the first gate pulse.

9. A semiconductor memory circuit as set forth in claim 8, further comprising fifth gate means, operatively connected between said first and second bit lines and said third and fourth gate means, turning on upon receipt of the second gate pulse.

10. A semiconductor memory circuit comprising:
    first and second bit lines each having a high or low level logic state;
    a memory cell having a flip-flop circuit, said flip-flop circuit having first and second pull-down transistors operatively connected to said first and second bit lines, respectively;
    first and second load transistors, operatively connected between a power source and said first and second bit lines, respectively, said first and second load transistors each having a control gate and each having a large $g_m$ state and a small $g_m$ state;
    a word line, operatively connected to said memory cell, for accessing said memory cell; and
    first and second feedback means, operatively connected between said first and second bit lines and said control gates of said second and first load transistors, respectively, for controlling the one of said load transistors, which is connected to said lower level bit line, to have the small $g_m$ state, and for controlling the other one of said load transistors, which is connected to said higher level bit line, to have the large $g_m$ state.

11. A semiconductor memory circuit as set forth in claim 10, wherein said first and second feedback means comprise first and second NOR logic gates, respectively, each of said logic gates having a first input operatively connected to a respective bit line, and having a second input operatively connected to receive a gate pulse, each of said logic gates having an output operatively connected to said control gates of said second and first load transistors, respectively, whereby said first and second feedback means are de-activated upon receipt of the gate pulse to immediately cause said first and second load transistors to have small $g_m$ states for a predetermined interval of time after which said first and second feedback means control said first and second load transistors to have a small $g_m$ state and a large $g_m$ state, accordingly.

12. A semiconductor memory circuit as set forth in claim 10, wherein said first and second feedback means comprise first and second level means for inverting the magnitude of the levels of said first and second bit lines, respectively, and applying the respective inverted levels to said control gates of said second and first load transistors, respectively.

13. A semiconductor memory circuit as set forth in claim 12, wherein each of said first and second level means comprises an inverter.

14. A semiconductor memory circuit as set forth in claim 10, operatively connected to receive a gate pulse and a supply of power, further comprising first and second gate means, respectively, operatively connected to said first and second bit lines and operatively connected to receive the gate pulse, for stopping the supply of power to said first and second bit lines upon receipt of the gate pulse during a predetermined interval.

15. A semiconductor memory circuit as set forth in claim 14, wherein said first and second gate means are operatively connected between the power supply and said first and second load transistors, respectively.

16. A semiconductor memory circuit comprising:
first and second bit lines each having a high or low level logic state;
a memory cell including transistors selected from among P-channel or N-channel transistors operatively connected to said first and second bit lines, respectively;
first and second load transistors having conductivity types opposite the conductivity type of said transistors of the memory cell, operatively connected between a power source and said first and second bit lines, respectively, said first and second load transistors each having a control gate and each having a large $g_m$ state and a small $g_m$ state;
a word line, operatively connected to said memory cell, for accessing said memory cell; and
first and second feedback means including first and second wirings, said first wiring operatively connected between said first bit line and said control gate of said second load transistor and said second wiring operatively connected between said second bit line and said control gate of said first load transistor, for controlling one of said load transistors connected to said bit line having the lower level, to have the small $g_m$ state, and for controlling the other one of said load transistors connected to said bit line having the higher level, to have the large $g_m$ state.

* * * * *

UNITED STATES PATENT AND TRADEMARK OFFICE
CERTIFICATE OF CORRECTION

PATENT NO. : 4,578,778
DATED : MARCH 25, 1986
INVENTOR(S) : KEIZO AOYAMA

It is certified that error appears in the above-identified patent and that said Letters Patent is hereby corrected as shown below:

Col. 2, line 62, "continous" should be --continuous--.

Col. 4, line 7, "manual" should be --mutual--;
line 29, "transistors" should be --transistor--.

Col. 6, line 21, "state" should be -- gate --;
line 61, "transistor" should be -- transistors --.

Col. 7, line 18, "BL" should be --$\overline{BL}$--;
line 42, delete "the".

Signed and Sealed this

Eighth Day of July 1986

[SEAL]

Attest:

DONALD J. QUIGG

Attesting Officer

Commissioner of Patents and Trademarks